United States Patent
Roure Pastor et al.

(10) Patent No.: US 10,434,805 B2
(45) Date of Patent: Oct. 8, 2019

(54) DISCHARGE OF HEATED FLUID FROM A PRINTER

(71) Applicant: HEWLETT-PACKARD DEVELOPMENT COMPANY, L.P., Houston, TX (US)

(72) Inventors: Francesc Roure Pastor, Barcelona (ES); Santiago Forcada, Sant Cugat del Valles (ES); David Soriano Fosas, Sant Cugat del Valles (ES)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 15/546,209

(22) PCT Filed: Apr. 17, 2015

(86) PCT No.: PCT/EP2015/058437
§ 371 (c)(1),
(2) Date: Jul. 25, 2017

(87) PCT Pub. No.: WO2016/165780
PCT Pub. Date: Oct. 20, 2016

(65) Prior Publication Data
US 2018/0022127 A1    Jan. 25, 2018

(51) Int. Cl.
| | | |
|---|---|---|
| *B41J 29/377* | (2006.01) | |
| *H05K 7/20* | (2006.01) | |
| *B41J 29/00* | (2006.01) | |
| *B41J 2/01* | (2006.01) | |
| *B41J 29/393* | (2006.01) | |

(52) U.S. Cl.
CPC ............. *B41J 29/377* (2013.01); *B41J 2/01* (2013.01); *B41J 29/00* (2013.01); *B41J 29/393* (2013.01); *H05K 7/20* (2013.01)

(58) Field of Classification Search
CPC combination set(s) only.
See application file for complete search history.

(56) References Cited

U.S. PATENT DOCUMENTS

| | | | |
|---|---|---|---|
| 3,086,457 A | | 4/1963 | Antonucci |
| 4,496,824 A | | 1/1985 | Kawai et al. |
| 4,628,992 A | * | 12/1986 | Kennedy ............ H05K 7/20145 165/123 |
| 5,406,316 A | | 4/1995 | Schwiebert et al. |
| 5,500,667 A | * | 3/1996 | Schwiebert ............ B41J 11/002 219/216 |
| 5,526,229 A | | 6/1996 | Wakabayashi et al. |
| 5,720,171 A | * | 2/1998 | Osterhoff ............ A47J 36/2461 62/298 |

(Continued)

FOREIGN PATENT DOCUMENTS

JP    H04296584    10/1992

*Primary Examiner* — Shelby L Fidler
(74) *Attorney, Agent, or Firm* — HP Inc. Patent Department

(57) ABSTRACT

An apparatus includes a processor to provide a control Signal for a printhead of a printer and a housing including a cavity. The processor is arranged in the cavity. The apparatus has a first opening and a second opening in the housing and in communication with the cavity. The first opening receives a first part of a fluid flow passing the housing, and the second opening discharges heated fluid from the cavity.

14 Claims, 7 Drawing Sheets

(56) References Cited

U.S. PATENT DOCUMENTS

| | | | |
|---|---|---|---|
| 5,774,141 A | 6/1998 | Cooper et al. | |
| 6,203,152 B1 | 3/2001 | Boleda et al. | |
| 6,591,897 B1 | 7/2003 | Bhatti et al. | |
| 6,842,186 B2 | 1/2005 | Bouchard et al. | |
| 8,994,169 B2 * | 3/2015 | Kim | H01L 23/043 257/721 |
| 9,867,312 B2 * | 1/2018 | Lin | H05K 7/20009 |
| 2006/0187245 A1 * | 8/2006 | Kudoh | B41J 2/1652 347/3 |
| 2008/0278560 A1 * | 11/2008 | Niekawa | B41J 2/2103 347/102 |
| 2011/0102505 A1 * | 5/2011 | Kagami | B41J 3/543 347/37 |
| 2013/0215203 A1 * | 8/2013 | Chen | B41J 11/002 347/102 |
| 2014/0060782 A1 * | 3/2014 | Ikeda | B41J 11/007 165/104.26 |
| 2016/0288554 A1 * | 10/2016 | Nakamura | B41J 2/2146 |

\* cited by examiner

DISCHARGE OF HEATED FLUID FROM A PRINTER

BACKGROUND

In some printers, referred to as page wide array (PWA) printers, a substrate wide stationary printhead or group of printheads commonly referred to as a print bar is used to print onto paper or other print substrates or print targets moving past the print bar. In other printers, referred to as carriage printers, a carriage is provided that is movable in a carriage scan direction substantially perpendicular to an advance direction of a print target, the carriage carrying a printhead used to print on the paper or on another print substrate or print target over which the carriage moves. Control signals for controlling the printhead for printing may be provided by a processor.

DRAWINGS

DESCRIPTION

Figure 1:
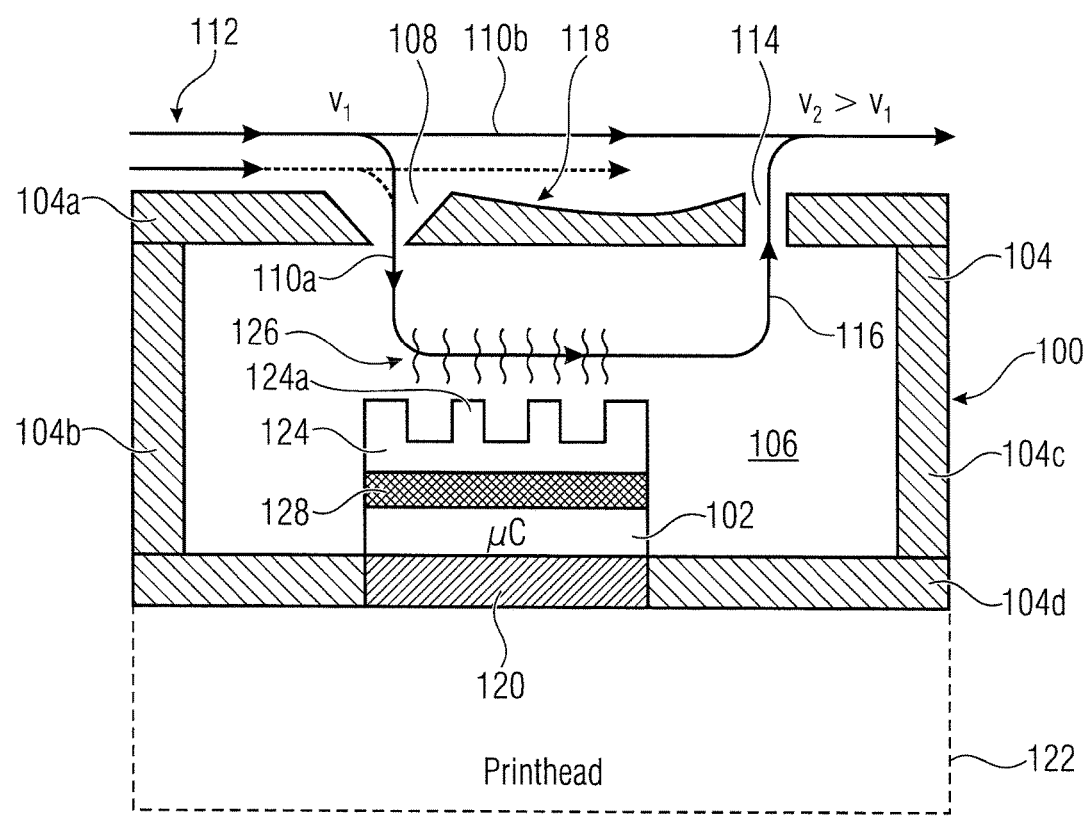
FIG. 1 is a schematic representation of an apparatus including a processor for providing a control signal for a printhead of a print according to an example.

Printers, including both page-wide array printers as well as carriage printers, include at least one printhead that is used to print onto a print target. In accordance with an example a printer may include a 2D printer, for example an inkjet printer, printing an image onto a paper or another printing substrate, also referred to as print medium. In another example, the printer may include a 3D printer, for example an inkjet printer, printing on a bed of build material The printhead includes a plurality of firing chambers for ejecting drops of a printing fluid through nozzles in response to respective signals activating a selected one of the firing chambers in accordance with the image or the 3D structure to be printed. To provide the respective activation signals for the firing chambers, the printer includes a processor, for example an FPGA processor, that generates, under control of a printer controller in the printer, respective control signals or activation signals that are applied to the printhead. The printhead is coupled to this processor, for example removably, so that when the printhead is installed and printing is desired, the firing chambers in the printhead may be selectively activated using the control signals or activation signals provided by the processor under control of the print controller receiving the data representing the image or the structure to be printed. The processor may be arranged inside an electrical enclosure of an electronics module of the printer.

Dependent on the amount of data to be processed by the or dependent on the speed with which the processor operates, the temperature in the processor changes, i.e., with an increase in data and/or speed the temperature, during operation, will rise. To ensure the correct functionality the processor is operated within its acceptable working temperature condition specified, in general, by the manufacturer of the processor. The processor inside the electrical enclosure of the electronics module of the printer an electronics module of a printer may be arranged in a confined area with little space around so that with an increase in data and/or speed the processor may leave its acceptable working temperature condition which may result in malfunctions of the processor or even lead to a processor failure. This may be even more severe in an electrical enclosure having limited real-estate available for mounting components. This malfunction of the processor providing the control signals for the printhead may result in a deterioration of the printed image.

To operate at higher data rates/processing speeds a higher level processor model may be used which may be operated at higher temperatures. A change to a higher level model will increase the direct manufacturing costs of the printer or the electronics module for the printer. This may add complexity to the supply chain strategy as such higher level components may not be so common and easily obtainable when compared to lower level components.

The temperature inside the electrical enclosure of an electronics module of the printer may be maintained in the working temperature condition of the processor by using additional hardware, for example a dedicated fan for a forced air convection. This is a space consuming option that may not be feasible due to the space restrictions inside the electrical enclosure of the electronics module of the printer. Dedicated fans provided inside the electrical enclosure, besides being too space consuming, may not provide the air volume for recirculating the heat. Adding an additional hardware element, such as the fan, may increase the direct manufacturing costs.

To increase the working temperature inside the electrical enclosure of the electronics module the natural air convection may be increased by an increase in the air volume inside the electrical enclosure. This is a space consuming option that may not be feasible due to space restriction inside the electrical enclosure of the electronics module, and may result in a growth of the footprint of the subsystem.

The techniques described herein allow to operate a processor providing control signals for a printhead of a printer within an acceptable temperature range, even in case of an increase of the data rate/processing speed, without adding additional space consuming dedicated hardware elements, such as fans, increasing the volume inside the electrical enclosure of the electronics module in which the processor is arranged, or upgrading the processor to a higher level model. The techniques described herein ensure for functionality and reliability of the processor as, in accordance with examples, it will operate within its prescribed operation conditions, thereby reducing the failure rate and/or the service interventions.

FIG. 1 is a schematic representation of an apparatus implementing a technique described herein according to an example. The apparatus 100 may be part of an electronics module of a 2D or 3D printer, such as a page wide array inkjet printer or a carriage inkjet printer. The apparatus comprises a processor 102, for example an processor. The apparatus 100 includes a housing 104, also referred to as the electrical enclosure of the electronics module, having a cavity 106 in which the processor 102 is arranged. The housing 100 comprises a first opening 108 that is in communication with the cavity 106. The first opening 108 receives a first part 110a of a fluid flow 112 passing the housing 104. The housing 104 comprises a second opening 114 that is in communication with the cavity 106. The second opening 114 is provided to discharge heated fluid 116 from the cavity 106. Between the first opening 108 and the second opening 114 an area 116 is provided which is shaped to accelerate a second part 110b of the fluid flow 112 not entering the first opening 108 so as to decrease the fluid pressure at the second opening 114. In FIG. 1 the velocity of the fluid flow 112 at the first opening 108 is indicated as $v_1$, and the shape of the area 118 depicted in FIG. 1 causes an acceleration of the flow 112 from the speed v1 to the speed v2 which is greater than the speed $v_1$. This increase in speed, in turn, causes, at or in the second opening 114 a pressure decrease supporting the discharge of heated air 116 out of the cavity or electrical enclosure 106.

The first and second openings 108 and 114 and the shaped area 118 may be provided at the top of the housing 104, for example, in a top cover 104a. Such a configuration may exploit the fact that the heated air inside the cavity 106 raises upwards. This may support the removal of the heated air 116 by suction due to the reduced pressure at the second opening 114. In accordance with other examples the raising of the heated air inside the cavity 106 may not be exploited and in such examples the openings 108 and 114 and the area 118 may be provided at other parts of the housing 104, for example in one of the vertical walls 104b, 104c of the housing or even in the bottom 104d of the housing.

In accordance with examples, the apparatus 100 may comprise an interface 120 connected to the processor 102 and provided for interfacing with a printhead for receiving the control or activation signals from the processor 102, which may be a microprocessor. The printhead may be fixedly or removably mounted to the printer to be in contact with the interface 120.

In accordance with examples, the apparatus 100 may comprise a heat sink 124, for example an aluminum heat sink having a plurality of fins 124a increasing the surface area of the heat sink 124 for dissipating heat generated by the processor 102 into the cavity 106 as is schematically represented at 126. The part 110a of the fluid flow, for example the air flow 112, that enters the cavity 106 through the first opening 108 is loaded with the dissipated heat 126, thereby generating the heated fluid or air 116 that is discharged from the cavity 106 using the above described principles.

The apparatus 100 may include a pump inside the electrical enclosure to supply pressurized air for printhead cleaning. The pump may comprise a support made from aluminum which may be used as the heat sink so that no new part is introduced. In accordance with examples, for a better heat conductivity between the heat sink 124 and the processor 102 a heat conductive element 128 may be provided, e.g., a heat conductive foam. This may be a non-expensive part not adding much to the overall costs of the manufacturing process or complicating the manufacturing process. The remaining components of the apparatus 100 may continue to serve their original functions with the housing being modified in accordance with the cooling strategy as an additional function, thereby allowing the temperature to be within a desired range that, in accordance with examples, allows to stay with commercial high speed components which avoids an upgrade to a more expensive or rare model.

In accordance with examples, the fluid or air flow 112 is provided by an external source already present in the printer in which the apparatus 100 is mounted stationary or it may be provided due to the movement of a carriage of the printer on which the apparatus 100 is mounted and which is moved across the print media during printing. The fluid or air flow 112 present within the printer may be re-used for supporting the cooling of the processor, for example a high speed processor inside the electrical enclosure or housing 100. Natural convection may be used to move the heated or hot air inside the electrical enclosure 100 from a lower part of the cavity 106 where the processor 102 is arranged to an upper position closer to the top cover 104a of the housing 104 and the air flow 110a and 116 forced through the cavity 106 in the above described way removes the heated air from the cavity by renewing the air due to the first part 110a of the air flow being introduced through the first opening 108.

The above described cooling strategy for the processor 102 which may be a high speed processor, ensures the correct functionality of the processor 102 by avoiding a situation in which the processor gets out of its acceptable working temperature condition. In examples of the techniques described herein no additional hardware elements, such as a fan, to cool the processor nor an extra air volume to increase the natural convection are provided.

Figure 2:
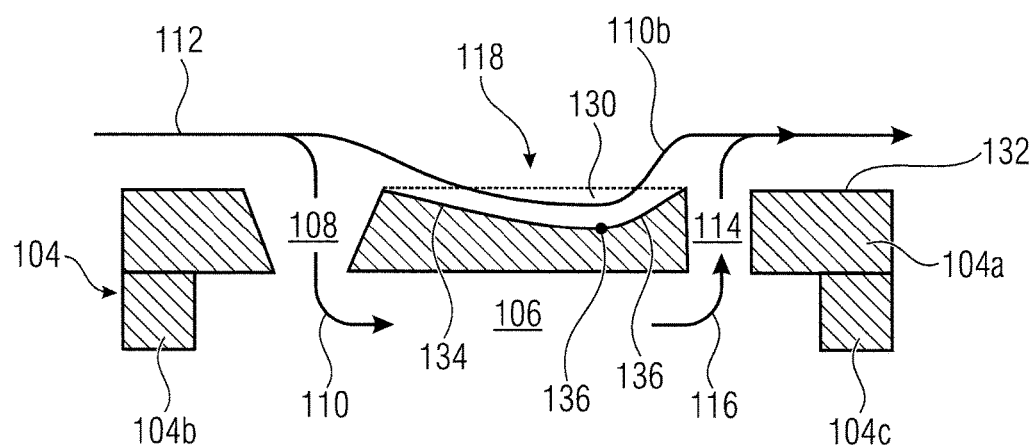
FIG. 2 shows an example of a shape of an area of the apparatus of FIG. 1 between two openings in an upper surface thereof.

FIG. 2 shows an example of the area 118 in further detail. In the example of FIG. 2, the area 118 comprises a recess 130 formed in an upper or outer surface 132 of the housing 104, e.g., in the top cover 104a of the housing 104. The recess 130 comprises a first inclined surface 134 extending from the first opening 108 and from the outer surface 132 downward to an intermediate location 136 in the recess 130 which, when compared to the level of the outer surface 132, may be the deepest location of the recess 130. The intermediate location 136 is arranged at a position closer to the second opening 114. The recess 130 comprises a second inclined surface 138 extending from the intermediate location 136 to the second opening 114 and back up to the level of the outer surface 132 of the housing. This structure of the area 118 causes the acceleration of the air flow part 110b, thereby generating at the opening 114 the lower pressure supporting the suction of the heated or hot air 116 from the inside of the housing 104. The recess 130 having the above described structure causes the diameter of the air flow when viewed along the air flow direction to increase until the intermediate location 136 and to decrease quickly from the intermediate location 136 to the area of the opening 114, thereby increasing the speed of the flow. The recess 130 in accordance with the example of FIG. 2 may be provided to avoid an increase in the outer dimension of the electronics module 104.

Figure 3:
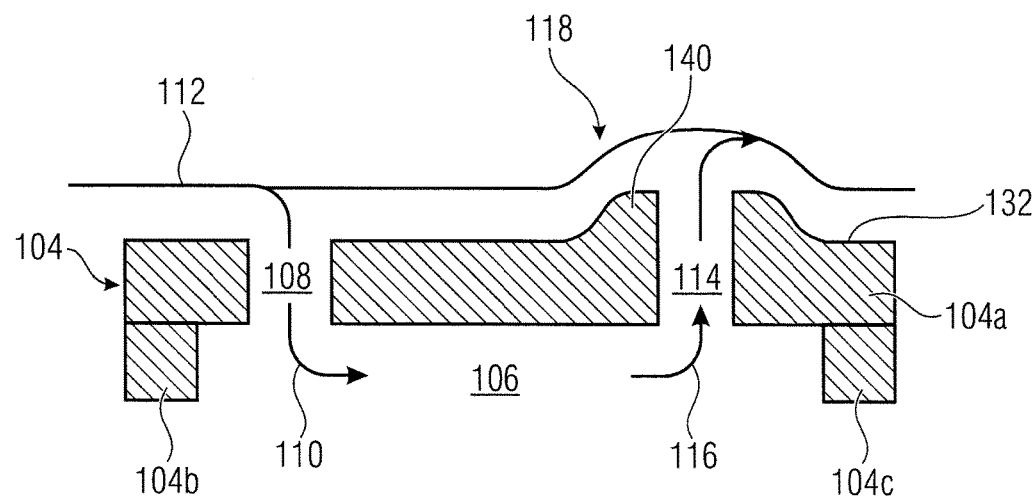
FIG. 3 shows another example of a shape of an area of the apparatus of FIG. 1 between two openings in an upper surface thereof.

FIG. 3 shows another example for implementing the area 118 for achieving an increase in the speed of the air flow across the top cover of the housing in the area of the second opening. FIG. 3 is an example which may be applied when a small increase in the height of the housing or electronics module 104 is tolerable. In the example of FIG. 3, the area 118 comprises a protrusion 140 extending above the outer surface 132 of the top cover 104a of the housing 104. The protrusion 140, in a similar way as in the example of FIG. 3, causes a reduction of the air flow diameter when viewed in the air flow direction of the air flow 112 in the area of the second opening 114, thereby increasing the speed of the air flow creating a negative pressure or reduced pressure at the opening 114, thereby supporting the discharge of heated air 116 by a suction thereof out of the cavity 106. The protrusion 140 may be provided on both sides of the opening 104. In some examples, the protrusion may be provided on the side of the opening adjacent to the first opening 108 or it may be formed by an annular protrusion surrounding the second opening 114.

In the examples described above with regard to FIGS. 2 and 3, specific shapes of the recess 130 and the protrusion 140 have been described. However, in accordance with other examples, the shapes may be different as long as a reduction of the air flow diameter is achieved in the vicinity of the second opening 114. In accordance with examples, to obtain the desired increase of the velocity at the second opening, the recess/protrusion 130, 140 are provided at a location between the first and second openings 108, 114 which is closer to the second opening 114 than to the first opening 108. In case a recess is formed, the intermediate location 136, in accordance with examples, may be provided closer to the second opening than to the first opening.

Figure 4:
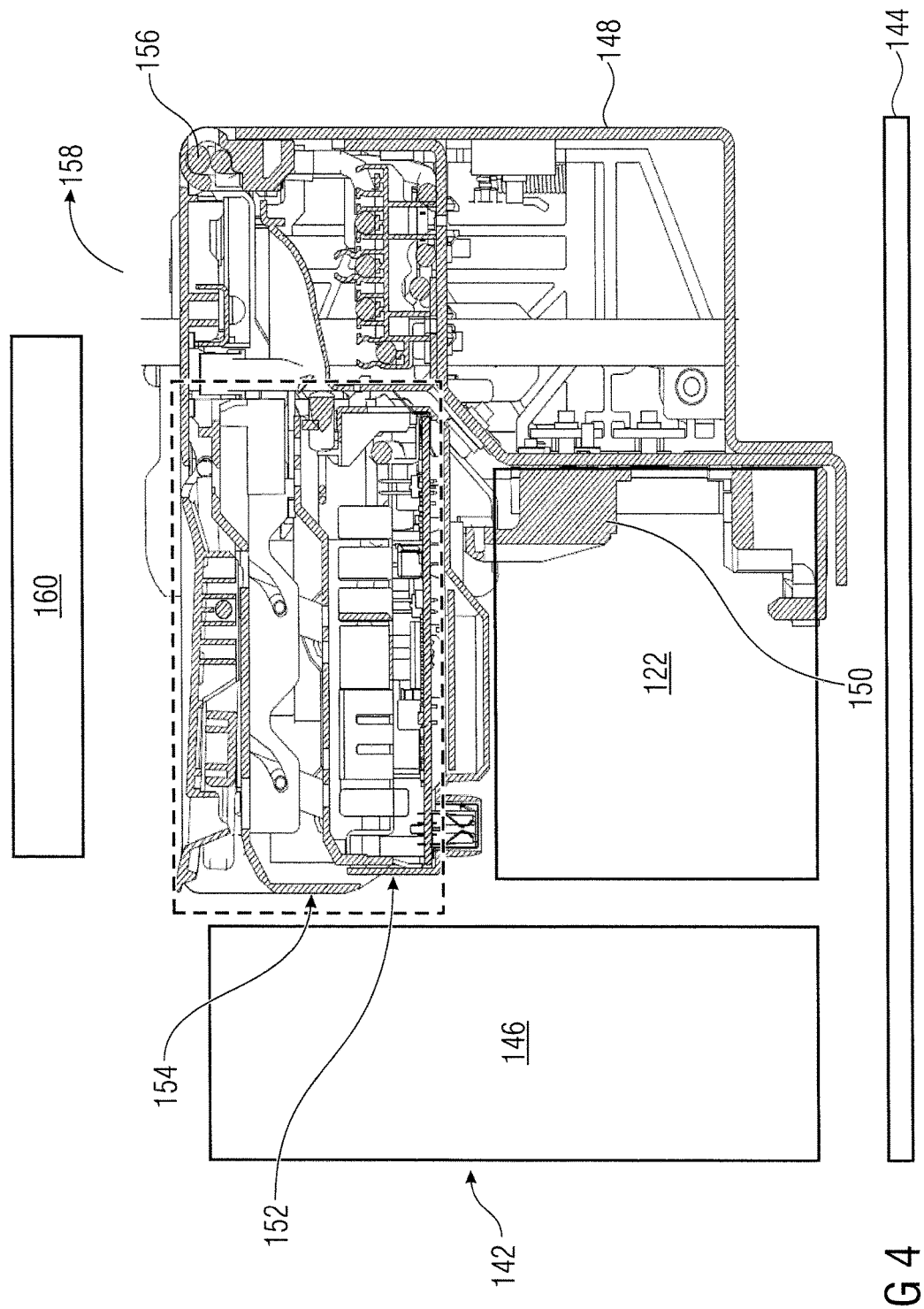
FIG. 4 is a schematic representation of a page wide array (PWA) printer according to an example.

In the following, an example will be described implementing the technique described herein in a page wide array (PWA) inkjet printer. FIG. 4 is a schematic representation of the PWA printer 142 that comprises a print zone 144, a front beam 146 and a back beam 148. The front beam 146 and the back beam 148 may also be referred to as the printer chassis. The back beam 148 comprises a mounting structure schematically represented at 150 by which a printhead 122 may be removably mounted to the back beam 148. In FIG. 4, the printhead 122 is depicted schematically and, when being mounted, is stationary so as to form the printhead or print bar for the page wide array printing. In accordance with examples, a plurality of printheads 122 may be arranged in a row, for example, eight printheads 122 with associated electronics may be mounted to the back beam 148 using respective mounting structures 150.

The PWA printer 132 comprises an electronics module 152 including the processor for providing control signals for activating respective nozzles of the printhead 122. To provide for a fixing of the printhead 122 when being mounted onto the mounting structure 150 and to provide for a reliable electrical connection between the processor and the printhead 122, the PWA printer 132 may comprise a latching system 154 including a hinge 156 allowing the latching system to be opened by swinging it into a direction as indicated by the arrow 158 together with the electronics module 154, thereby allowing the inserting/removing the printhead 122. In the latched position the latching system 154 applies a vertical force to the printhead 122 fixing it at a position defined by respective datum pint surface on the mounting structure 150 and making electrical contact to the processor inside the electronics module 152.

The printer 142 comprises an aerosol fan 160 arranged above the print zone 144 with the printhead 122, the electronics module 152 and the latching mechanism 154 being arranged between the print zone 144 and the aerosol fan 160.

Figure 5:
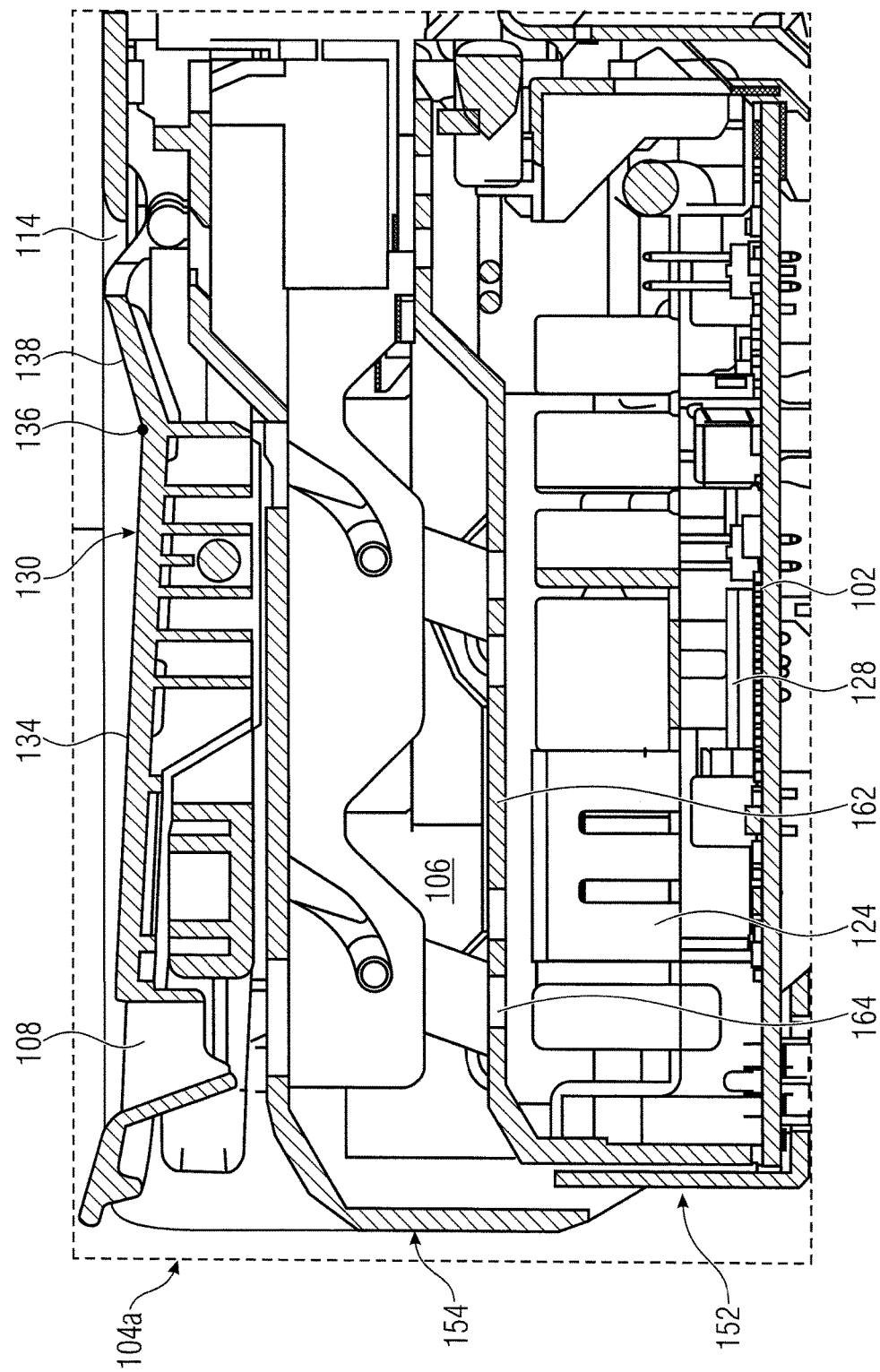
FIG. 5 shows an enlarged view of a part of the printer in FIG. 4 according to an example.

FIG. 5 shows an enlarged view of a part of the printer 142 indicated in FIG. 4 by the dashed line. FIG. 5 is an enlarged view of the electronics module 152 and a part of the latching system 154 arranged above the electronics module 152. In accordance with examples, the housing may comprise the top cover 104a formed by a part of the latching mechanism 154. The cavity 106 includes an interior wall 162 including a plurality of openings 164 for connecting a lower part of the cavity 106 in which the processor 102, the heat sink 124 and the heat conductive element 128 are arranged, and an upper portion having as an upper wall the top cover 104a.

Figure 6:
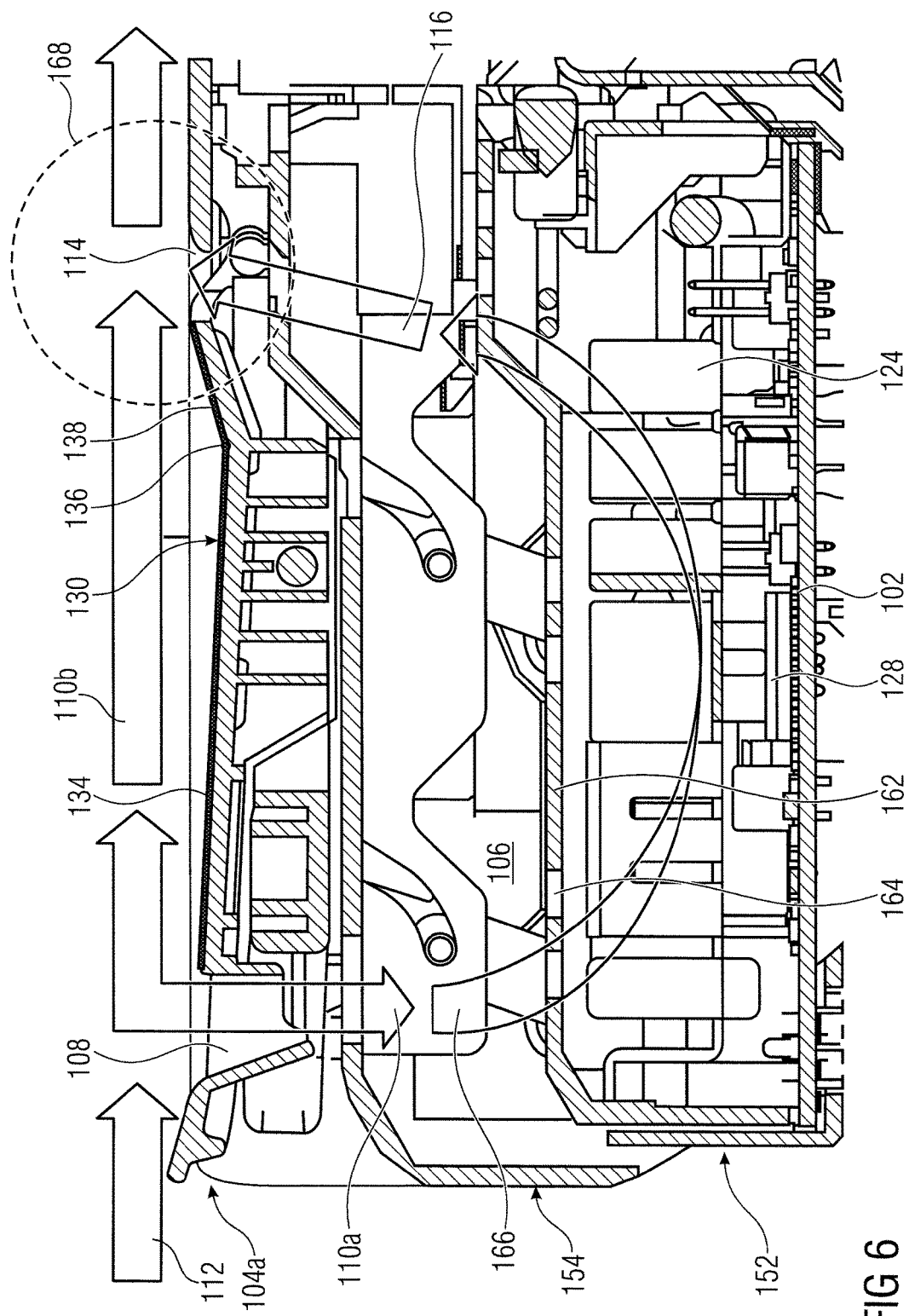
FIG. 6 is the enlarged view of FIG. 5 showing the air flow in the electronics module and the part of a latching system according to an example.

FIG. 6 is the enlarged view of the electronics module 152 and a part of the latching system 154 of FIG. 5 showing the air flow through the apparatus. During operation, the external air flow 112 that may be provided by the aerosol fan 160 passes over the top cover 104a of the housing and a first part 110a of the air flow is entering the cavity 106 through the opening 108. The air flow enters the lower part of the cavity 106 through the openings 164 in the interior 162, as is depicted by arrow 166 indicating the air flow inside the cavity 106 across the heat sink 124. The heated air 116 leaves the cavity 106 through the opening 114. The area between the first and second openings 108 and 114 comprises the recess 130 similar to the one described in FIG. 2 so as to accelerate the second part 110b of the air flow 112 which does not enter the first opening 108. The structure of the recess 130, as described above, results in the acceleration of the air flow and a reduction of the pressure in the vicinity of the second opening 114 (see the area indicated by the circle 168). The design of the top cover 104a may be referred to as a flap-similar shape as indicated by the bold line in FIG. 6. This shape accelerates the flow 110b not entering the cavity 106 and, as the speed of the top air flow 110a at the second opening 114 of the top cover 104a has an increased speed, a pressure decrease is generated supporting the suction of the heated air 116 out from the cavity 106. The first and second openings 108 and 114 may be formed by respective slots in the top cover 104a. Instead of providing a slot, each of the openings may be formed by a respective plurality of openings arranged, for example, in a line. Different shapes of the openings may be used, for example circular shapes or polygonal shapes.

Figure 7:
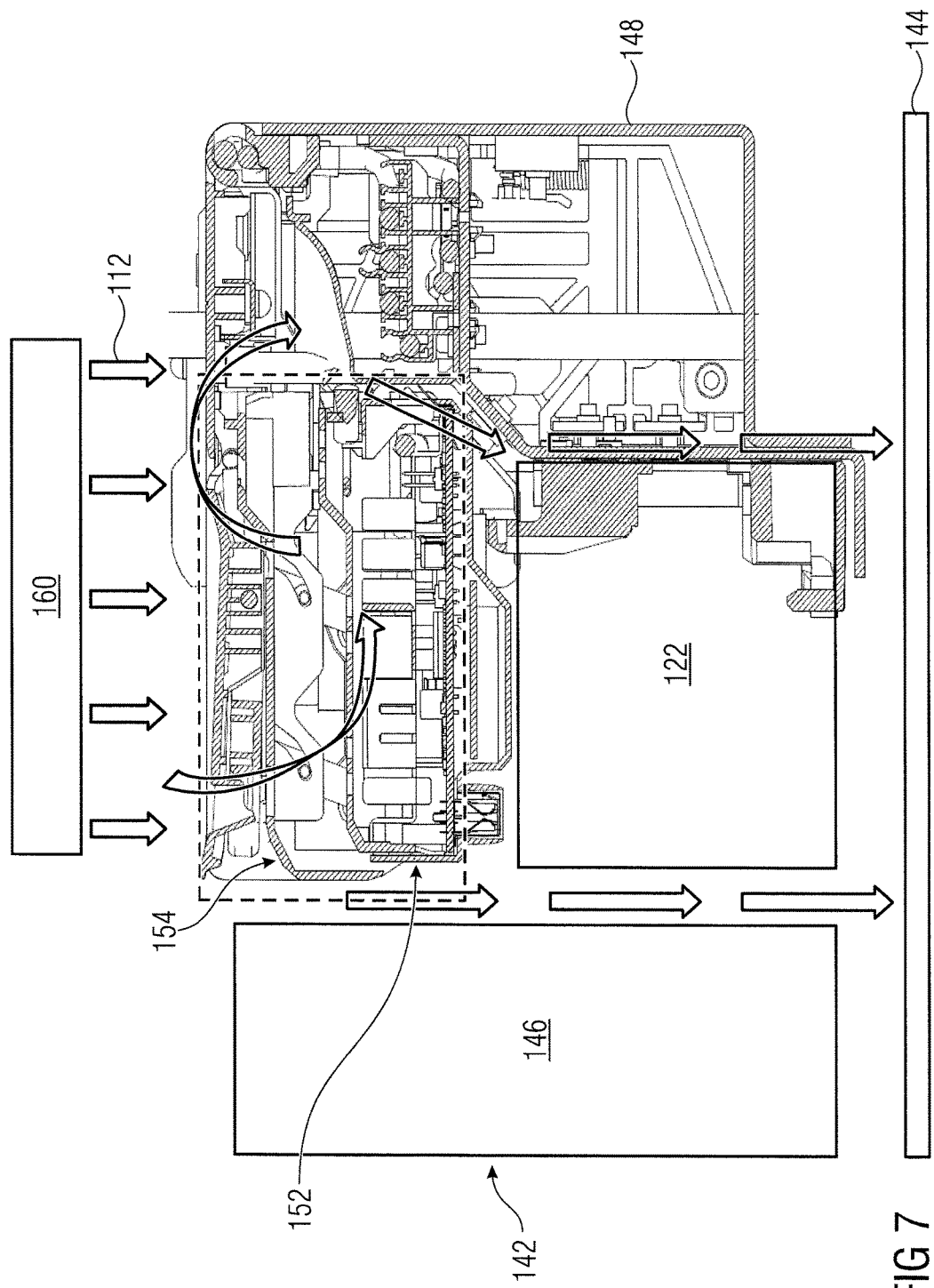
FIG. 7 shows the air flow through the printer in FIG. 4 according to an example.

FIG. 7 is a view of the printer 142 described with reference to FIG. 4 showing the air flow through the printer. The air flow 112 is shown which is generated by the aerosol fan 160. The air flow 112 is directed towards the print zone 144 and passes between the front beam 146 and the printhead 122 towards the print zone 144 and through respective openings in the back beam 148 towards the print zone 144, thereby creating an air flow on the front side and on the back side of the printhead 122 urging printing fluid particles, e.g., ink particles, towards the print zone 144 and away from the printer components, thereby avoiding undesired contamination of printer components and possible deteriorations of their function.

A cooling strategy in the electrical enclosure 152 for the high speed processor 102, in accordance with an example of the teachings described herein, will now be described. The cooling strategy for the high speed processor 102 is provided to ensure a correct function of the processor. If the processor leaves its acceptable working temperature condition the function thereof may not be within prescribed parameters and incorrect activation signals may be provided to the printhead 122 or the processor may even fail. The technique described herein ensures a proper cooling strategy in the electrical enclosure 152 despite the fact that limited real-estate is available and avoids additional hardware elements, such as dedicated fans or an increased air volume for recirculating the heat. In the example of the printer described with reference to FIGS. 4 to 7, the forced air convection provided by the aerosol system 160 is used to promote the discharge of heated air from inside the electrical enclosure through openings in the top cover thereof. The aerosol fan 160 which is placed above the latching system 154 faces the print zone 144 in order to force all aerosol particles of the printing fluid printed by the printhead to stick to the printed media and not to stick to any other printer component. The air flow 112 passes between the front beam 146 and the printhead 122 and between the back beam 148 and the printhead 122. In addition, the air flow hitting the top cover 104a of the latching system 154 is used to renew the air inside the electrical enclosure 152. The flow 112 enters the volume or cavity 106 through a first opening, also referred to as a front entrance 108, which, in accordance with the examples, may have the shape of a nozzle. The first opening 108 may have a diameter decreasing towards the interior of the cavity. This shape, in accordance with examples, may be provided to enhance the flow through the interior of the cavity 106 by accelerating the flow upon entry into the cavity. The flow which entered through the front entrance 108, through the openings 164, enters the electrical enclosure 152, takes the heated or hot air dissipated by the heat sink 124 which may be formed of aluminum and leaves the electrical enclosure 152 through openings 164 in the wall 162 which are closer to the back beam 148 than those openings through which the air flow entered the enclosure 152 which are closer to the front beam 146. The flow now being loaded with the heated air leaves the cavity 106 through the back slot 114 on the top cover 104a and joins the flow 112 from the aerosol fan array 160 and is directed downwards to the print zone 144. The discharge of the heated air from the inside of the printer is promoted by the shape of the area between the front slot 108 and the back slot 114 generating a decreased pressure at the back slot 114, thereby supporting the suction of the heated air out of the cavity 106. The heat generated by the high speed processor 102 is conducted through a heat conductive foam 128 to the aluminum heat sink 124 which is dissipating the heat through air convection and the hot air is moved up to the top of the electrical enclosure where it is renewed with fresh air coming from the above mentioned flow entering the volume 106.

So far, the examples implementing the technique described herein have been described in the context of a PWA printing system, for example the one described with regard to FIGS. 4 to 7. The technique described herein is not limited to the field of page wide array printers. Rather, in accordance with other examples, the technique described herein may be applied to carriage printers.

Figure 8:
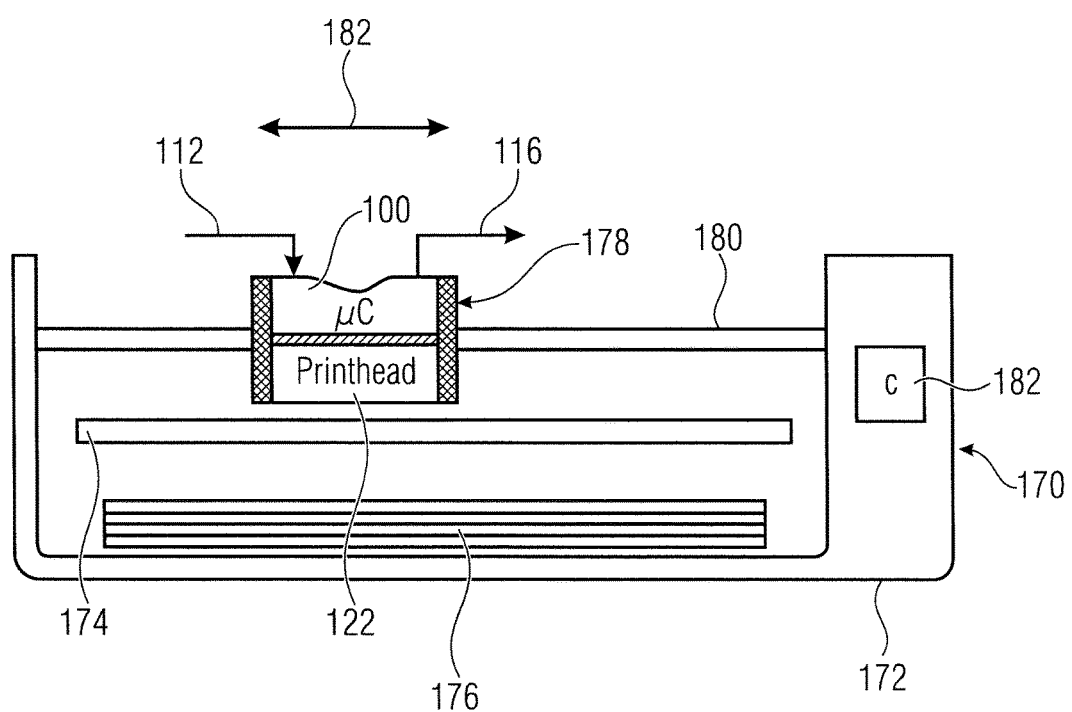
FIG. 8 shows a schematic view of a carriage printer according to an example.

FIG. 8 shows a schematic view of a carriage printer 170. The carriage printer 170 comprises a printer chassis 172. The chassis 172 comprises a print zone 174 that may be formed by a platen for receiving a print medium to receive a printing fluid for generating an image or a 3D structure thereon. The print medium, for example paper, may be provided by a paper reservoir 176, for example a paper tray, provided in the chassis 172 of the carriage printer 170. The printer 170 comprises a carriage 178 carrying a printhead 122 and the apparatus 100 described above in detail. The carriage 178 is mounted onto a bar 180 and is movable along the bar as indicated by arrow 182 in a carriage scan direction that is substantially perpendicular to a media advance direction. The printer 170 may comprise a printer controller 182 schematically represented in the right-hand part of the chassis 172 which may include a printhead servicing station.

FIG. 8 schematically shows an air flow 112, part of which enters the apparatus 100 through an opening (not shown in FIG. 8), and the discharged air 116 discharged through the second opening (not shown in FIG. 8) of the apparatus. The air flow 112 is generated due to the movement of the carriage during printing and the part of the air flow not entering the interior volume of the apparatus 100 is accelerated for providing the reduced pressure at the output opening 114 for promoting the discharge of the heated air from the interior of the apparatus 100.

In the above description reference has been made to air provided, for example, by the aerosol fan system 160 in the PWA printer or due to the movement of the carriage of a carriage printer. In accordance with other examples, another fluid, e.g. another gaseous fluid, may be used.

Although some aspects of the techniques described herein have been described in the context of an apparatus, these aspects may also represent a description of the corresponding method. Analogously, aspects described in the context of a method also represent a description of a corresponding feature of a corresponding apparatus.

All of the features disclosed in this specification, including any accompanying claims, abstract and drawings, may be combined in any combination. Each feature disclosed in this specification, including any accompanying claims, abstract and drawings, may be replaced by alternative features serving the same, equivalent or similar purpose, unless expressly stated otherwise. Thus, unless expressly stated otherwise, each feature disclosed is one example of a generic series of equivalent or similar features.

The invention claimed is:

1. An apparatus, comprising:
a processor to provide a control signal for a printhead of a printer;
a housing including a cavity, the processor arranged in the cavity;
a first opening in a surface of the housing and in communication with the cavity, the first opening to receive a first part of a fluid flow passing the surface of the housing; and
a second opening in the surface of the housing and in communication with the cavity, the second opening to discharge heated fluid from the cavity,
wherein the surface has an area between the first opening and the second opening, the area shaped to accelerate a second part of the fluid flow not entering the first opening so as to decrease the fluid pressure at the second opening to support discharge of the heated fluid from the cavity by the first part of the fluid flow.

2. The apparatus of claim 1, wherein the area comprises a structure recessed in or protruding from outer surface of the housing, the structure disturbing the second part of the fluid flow and arranged closer to the second opening than to the first opening.

3. The apparatus of claim 2, wherein the structure comprises a recess having a first inclined surface extending from the first opening to an intermediate location in the recess and a second inclined surface extending from the intermediate location to the second opening, the intermediate location arranged closer to the second opening than to the first opening.

4. The apparatus of claim 2, wherein the structure comprises a protrusion arranged at the second opening than to the first opening.

5. The apparatus of claim 1, wherein the surface comprises a top cover including the first and second openings and the shaped area between the first and second openings.

6. The apparatus of claim 1, comprising a heat sink arranged in the cavity and coupled to the processor for dissipating heat generated by the processor to the first part of the fluid flow.

7. The apparatus of claim 6, wherein the heat sink and the processor are connected to each other via a heat conductive foam.

8. The apparatus of claim 1, comprising a printhead interface connected to the processor, the printhead interface to communicate signals between the processor and a fixedly or removable coupled printhead.

9. The apparatus of claim 1, wherein the apparatus is stationary mounted and the fluid flow is generated by an external fan.

10. The apparatus of claim 9, wherein the apparatus is mounted in a page wide array printer including an aerosol fan provided to avoid aerosol dispersion inside the printer, the aerosol fan generating the fluid flow.

11. The apparatus of claim 1, wherein the apparatus is movably mounted and the fluid flow is generated by the movement of the apparatus.

12. The apparatus of claim 11, wherein the apparatus is mounted on a carriage of a printer to move the apparatus and a printhead across a print medium, the fluid flow generated by the movement of the carriage.

13. A page wide array printer, comprising:
- a printer chassis including an apparatus and a print zone, wherein the apparatus comprises:
- a processor to provide a control signal for a printhead of a printer,
- a housing including a cavity, the processor arranged in the cavity,
- a first opening in a surface of the housing and in communication with the cavity, the first opening to receive a first part of a fluid flow passing the surface of the housing, and
- a second opening in the surface of the housing and in communication with the cavity, the second opening to discharge heated fluid from the cavity;
- a printhead removable mounted to the printer chassis between the apparatus and the print zone; and
- an aerosol fan mounted to the printer chassis such that the apparatus and the printhead are arranged between the print zone and the aerosol fan,
- wherein the surface has an area between the first opening and the second opening, the area shaped to accelerate a second part of the fluid flow not entering the first opening so as to decrease the fluid pressure at the second opening to support discharge of the heated fluid from the cavity by the first part of the fluid flow.

14. A carriage printer, comprising:
- a carriage movable in a carriage scan direction that is substantially perpendicular to an advance direction of a print target;
- an apparatus mounted to the carriage, wherein the apparatus comprises:
- a processor to provide a control signal for a printhead of a printer,
- a housing including a cavity, the processor arranged in the cavity,
- a first opening in a surface of the housing and in communication with the cavity, the first opening to receive a first part of a fluid flow passing the surface of the housing, and
- a second opening in the surface of the housing and in communication with the cavity, the second opening to discharge heated fluid from the cavity; and
- a printhead removable mounted to the carriage,
- wherein the surface has an area between the first opening and the second opening, the area shaped to accelerate a second part of the fluid flow not entering the first opening so as to decrease the fluid pressure at the second opening to support discharge of the heated fluid from the cavity by the first part of the fluid flow.

* * * * *